(12) United States Patent
Melanson et al.

(10) Patent No.: US 9,379,732 B2
(45) Date of Patent: Jun. 28, 2016

(54) DELTA-SIGMA MODULATOR WITH REDUCED INTEGRATOR REQUIREMENTS

(71) Applicant: Cirrus Logic, Inc., Austin, TX (US)

(72) Inventors: John L. Melanson, Austin, TX (US); Stephen T. Hodapp, Austin, TX (US)

(73) Assignee: CIRRUS LOGIC, INC., Austin, TX (US)

(*) Notice: Subject to any disclaimer, the term of this patent is extended or adjusted under 35 U.S.C. 154(b) by 0 days.

(21) Appl. No.: 14/845,899

(22) Filed: Sep. 4, 2015

(65) Prior Publication Data

US 2016/0072521 A1 Mar. 10, 2016

Related U.S. Application Data

(60) Provisional application No. 62/046,522, filed on Sep. 5, 2014.

(51) Int. Cl.
*H03M 1/30* (2006.01)
*H03M 3/00* (2006.01)

(52) U.S. Cl.
CPC ............. *H03M 3/30* (2013.01); *H03M 3/436* (2013.01); *H03M 3/44* (2013.01); *H03M 3/464* (2013.01)

(58) Field of Classification Search
CPC ....... H03M 3/44; H03M 3/464; H03M 3/436; H03M 3/30

USPC .................................................. 341/155, 143
See application file for complete search history.

(56) References Cited

U.S. PATENT DOCUMENTS

| | | | |
|---|---|---|---|
| 7,183,957 B1 | 2/2007 | Melanson | |
| 7,375,666 B2 | 5/2008 | Melanson | |
| 7,880,654 B2* | 2/2011 | Oliaei | H03M 3/374 341/143 |
| 8,319,674 B2* | 11/2012 | Loeda | H03M 3/37 341/143 |
| 8,629,793 B2* | 1/2014 | Tsai | H03M 3/39 341/143 |
| 8,847,804 B2* | 9/2014 | Braswell | H03M 3/344 341/143 |

* cited by examiner

*Primary Examiner* — Brian Young
(74) *Attorney, Agent, or Firm* — Norton Rose Fulbright US LLP

(57) ABSTRACT

Requirements placed on the first integrator of a filter in a continuous-time delta-feedback modulator may be reduced by using circuitry to reduce the speed of a signal provided to the first integrator of the modulator. The reduction in speed applied to the signal received at the first integrator may then be compensated with circuitry elsewhere in the modulator, such that the net effect of the slow down and speed up of signals does not affect the output of the modulator. The sigma-delta modulator may be implemented in converters, such as an analog-to-digital converter (ADC).

18 Claims, 5 Drawing Sheets

DELTA-SIGMA MODULATOR WITH REDUCED INTEGRATOR REQUIREMENTS

CROSS-REFERENCE TO RELATED PATENT APPLICATIONS

This application claims the benefit of priority of U.S. Provisional Patent Application No. 62/046,522 to Melanson et al. entitled "Delta-Sigma Modulator with Reduced Integrator Requirements" and filed Sep. 5, 2014, which is incorporated by reference herein.

FIELD OF THE DISCLOSURE

The instant disclosure relates to delta-sigma modulators. More specifically, portions of this disclosure relate to continuous-time delta-sigma modulators.

BACKGROUND

Delta-sigma modulators are particularly useful in digital-to-analog and analog-to-digital converters (DACs and ADCs). Using oversampling, the delta-sigma modulator spreads the quantization noise power across the oversampling frequency band, which is typically much greater than the input signal bandwidth. Additionally, the delta-sigma modulator performs noise shaping by acting as a low-pass filter to the input signal and a high-pass filter to the noise. Most of the quantization noise power is thereby shifted out of the signal band.

Delta-sigma modulators can be designed from various configurations, including the switched-capacitor approach and the continuous-time approach. Continuous-time delta-sigma modulators have certain advantages over switched-capacitor designs, such as certain designs having protection against signal aliasing and the possibility of wideband converters. Some conventional continuous-time delta-sigma modulators are shown in FIG. 1 and FIG. 2.

FIG. 1 is a circuit schematic illustrating a continuous-time delta-sigma modulator with a feedforward path. Delta-sigma modulator 100 receives an analog input signal and provides a digital output signal representative of the input analog signal. The delta-sigma modulator 100 has a feedforward path that includes resistors R, capacitors C, a first integrator 112, a second integrator 114, a third integrator 116, a summer 102, and a quantizer 104 coupled in series between the input and the output. The delta-sigma modulator 100 also has a feedback path that comprises a delay block 106, a digital-to-analog converter (DAC) block 108, and a resistor R coupled in series between the quantizer 104 and the first integrator 112.

The delta-sigma modulator 100 is conventionally referred to as a feedforward modulator, as the noise-transfer function (NTF) characteristics are set by the coefficients c0, c1, c2, and c3 fed forward to the summer 102. The three coefficients c1, c2, c3 allow for setting the poles of any noise transfer function (NTF). Feedforward term c0 from the input signal may be adjusted to obtain flexibility in setting the signal-transfer function (STF).

Advantages to feedforward delta-sigma modulators, such as shown in FIG. 1, include no signal energy provided at the outputs of the integrators 112, 114, and 116, which allows for better linearity. Another advantage is that only one DAC output signal, such as from DAC 108, is required or needs to be processed. Some disadvantages are that such feedforward delta-sigma modulators require a summer block, such as summer 102, and that the first integrator 112 must be low noise and fast. Another disadvantage is that feedforward delta-sigma modulators provide minimal natural anti-aliasing.

Another configuration for a continuous-time delta-sigma modulator implements feedback into the integrators of the filter. FIG. 2 is a circuit schematic illustrating a continuous-time delta-sigma modulator with multiple feedback paths. Delta-sigma modulator 200 receives an analog input signal and provides a digital output signal representative of the input analog signal. Delta-sigma modulator 200 has a feedforward path that includes resistors R, capacitors C, a first integrator 212, a second integrator 214, a third integrator 216, and a quantizer 204 coupled in series between an input and an output. The delta-sigma modulator 200 also includes a feedback path that comprises a delay block 206, a digital-to-analog converter (DAC) block 208, and resistors R1, R2, and R3 coupled between the output and each of the integrators 212, 214, and 216. Resistors R1, R2, and R3 are coupled to the inputs of respective integrators 212, 214, and 216.

The characteristics of the delta-sigma modulator 200 may be determined by setting values for resistors R1, R2, and R3. These values set the NTF coefficients, similar to the values of coefficients c1, c2, and c3 of FIG. 1. Advantages of the feedback-type delta-sigma modulator of FIG. 2 are that no summer is required, that some reduced speed constraints exist for the first integrator 212, and that the low-pass signal-transfer function (LP STF) provides inherent anti-aliasing characteristics. Disadvantages of the feedback-type delta-sigma modulator of FIG. 2 are that full signal swing exists at the outputs of all integrators 212, 214, and 216 placing stricter requirements on the integrators 212, 214, and 216, and that the DAC block 208 has to drive and feedback multiple outputs to the integrators 212, 214, and 216, which increases the complexity of the circuit.

A number of other modulator structures that incorporate both feedback and feedforward techniques exist, but generally trade one characteristic for another. These mixed modulator structures allow for various STF numerators with the denominator of the STF being shared with the NTF. Local feedback between the integrators can also be used to select the zero locations of the NTF, which in one configuration could set all of the NTF zeroes at Z=−1 or at a Direct Current (DC) value.

One example configuration showing a common challenge with these conventional modulator structures is provided by U.S. Pat. No. 7,375,666 entitled "Feedback Topology Delta-Sigma Modulator having an AC-coupled Feedback Path" to Melanson (hereafter the '666 patent), which is hereby incorporated by reference. The '666 patent shows an example feedback-type delta-sigma modulator. The '666 patent includes descriptions of modulator structures that remove the signal component from the output of an integrator in the filter. The first integrator of the modulator must have a relatively fast response, because it receives a feedback signal with fast edges which requires a high speed design in order to keep non-linear operation from happening in the first integrator. Additionally, certain capacitors of the modulator structure of the '666 patent need to be relatively large. These large capacitors increase the size and cost of an integrated circuit (IC) that encompasses such a feedback delta-sigma modulator.

The demands on the first integrator for a delta-sigma modulator can be minimized by using more bits in the DAC feedback element, but practical size and cost considerations limit how far that can be pushed. Thus, the conventional modulator structures used, for example, in analog-to-digital converters (ADC) fail to adequately process high-frequency feedback signals.

Shortcomings mentioned here are only representative and are included simply to highlight that a need exists for improved electrical components, particularly for analog-to-digital converters, such as those that may be employed in consumer-level devices, such as mobile phones, or other commercial technology employed in electronic detectors. Embodiments described herein address certain shortcomings but not necessarily each and every one described here or known in the art.

SUMMARY

Requirements placed on the first integrator of a filter in a continuous-time delta-feedback modulator may be reduced by using circuitry to reduce the speed of a signal provided to the first integrator of the modulator. The reduction in speed applied to the signal received at the first integrator may then be compensated with circuitry elsewhere in the modulator, such that the net effect of the slow down and speed up of signals does not affect the output of the modulator.

According to one embodiment, a continuous-time converter configured to convert an analog signal to a digital signal may include a filter comprising a plurality of integrators; a quantizer coupled to at least one of the plurality of integrators; and/or a feedback element coupled between the quantizer and at least one of the plurality of integrators. The filter may include first circuitry coupled to a first integrator of the plurality of integrators to change a characteristic of the first integrator; and/or second circuitry coupled to another integrator of the plurality of integrators to compensate for the changed characteristic of the first integrator.

According to one embodiment, a continuous-time converter includes a filter comprising a plurality of integrators; a quantizer coupled to at least one of the plurality of integrators; and/or a feedback element coupled between the quantizer and at least one of the plurality of integrators. The filter may include a low-pass filter coupled between the feedback element and a first integrator of the plurality of integrators; and/or one or more additional paths in the converter after the first integrator of the plurality of integrators that compensates for a low-pass characteristic of the low-pass filter. The one or more additional paths may include a second path in the converter after the first integrated of the plurality of integrators having a high-pass characteristic that compensates for a low-pass characteristic of the low-pass filter.

In certain embodiments of the continuous-time converters described above, the low pass filter may include a resistor and a capacitor; the resistor may be a metal resistor and the capacitor is a sidewall capacitor attached to the metal resistor; the second path may include a high-pass filter coupled between a second integrator of the plurality of integrators and the feedback element; the feedback element may include a digital-to-analog converter (DAC); the low-pass filter may be configured to slow down feedback arriving at the first integrator of the plurality of integrators; and/or the second path may be configured to speed up subsequent integrators of the plurality of integrators of the filter to compensate for the slow down at the first integrator.

According to another embodiment, a method may include receiving an analog input signal for conversion at an input node; processing the input signal through a plurality of integrators of a filter; quantizing an output of the filter to produce an output signal at an output node; feeding back the output signal to at least a first integrator of the plurality of integrators through a feedback element; modifying a characteristic of the feedback provided to the first integrator of the plurality of integrators; and/or compensating for the modified characteristic in another integrator of the plurality of integrators of the filter.

According to another embodiment, a method may include receiving an analog input signal for conversion at an input node; processing the input signal through a plurality of integrators of a filter; quantizing an output of the filter to produce an output signal at an output node; feeding back the output signal to at least a first integrator of the plurality of integrators through a feedback element; reducing a speed of the feedback to the first integrator of the plurality of integrators; and/or compensating for the reduced speed in a second integrator of the plurality of integrators of the filter.

In certain embodiments of these methods, the step of reducing the speed of the feedback may include applying a low-pass filter to the feedback applied to the first integrator; the step of applying the low-pass filter may include passing the feedback through a resistor and an integrator; the step of passing the feedback through the resistor and the integrator may include passing the feedback through a sidewall capacitor attached to the resistor; the step of compensating for the reduced speed may include applying a high-pass filter to feedback applied to a second integrator of the plurality of integrators; the step of compensating may include compensating with one or more additional paths including a path to the second integrator; and/or the step of reducing the speed of the feedback may include reducing a frequency response of the first integrator.

According to another embodiment, an analog-to-digital converter may include an input node configured to receive an input analog signal; an output node configured to output a digital signal representation of the input analog signal; and/or a continuous-time converter. The converter may be configured to perform steps including processing the input analog signal through a plurality of integrators of a filter; quantizing an output of the filter to produce the digital signal representation at the output node; feeding back the digital signal representation to at least a first integrator of the plurality of integrators through a feedback element; reducing a speed of the feedback to the first integrator of the plurality of integrators; and/or compensating for the reduced speed in a second integrator of the plurality of integrators of the filter.

According to another embodiment, an analog-to-digital converter may include an input node configured to receive an input analog signal; an output node configured to output a digital signal representation of the input analog signal; and/or a continuous-time converter. The continuous-time converter may be configured to perform steps of processing the input analog signal through a plurality of integrators of a filter; quantizing an output of the filter to produce the digital signal representation at the output node; feeding back the digital signal representation to at least a first integrator of the plurality of integrators through a feedback element; modifying a characteristic of the feedback provided to the first integrator of the plurality of integrators; and/or compensating for the modified characteristic in another integrator of the plurality of integrators of the filter.

In certain embodiments of the analog-to-digital converters, the step of reducing the speed of the feedback may include applying a low-pass filter to the feedback applied to the first integrator; the step of compensating for the reduced speed may include applying a high-pass filter to feedback applied to a second integrator of the plurality of integrators; the step of compensating for the reduced speed comprises compensating with one or more additional paths including a path to the second integrator; and/or the step of reducing the speed of the feedback may include reducing a frequency response of the first integrator.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Requirements placed on the first integrator of a filter in a continuous-time delta-feedback modulator may be reduced by using circuitry to reduce the speed of a signal provided to the first integrator of the modulator. The reduction in speed applied to the signal received at the first integrator may then be compensated with circuitry elsewhere in the modulator, such that the net effect of the slow down and speed up of signals does not affect the output of the modulator. One example of this technique for slowing down a signal and later compensating is applied to an analog-to-digital converter (ADC) as shown in FIG. 3.

Figure 1:
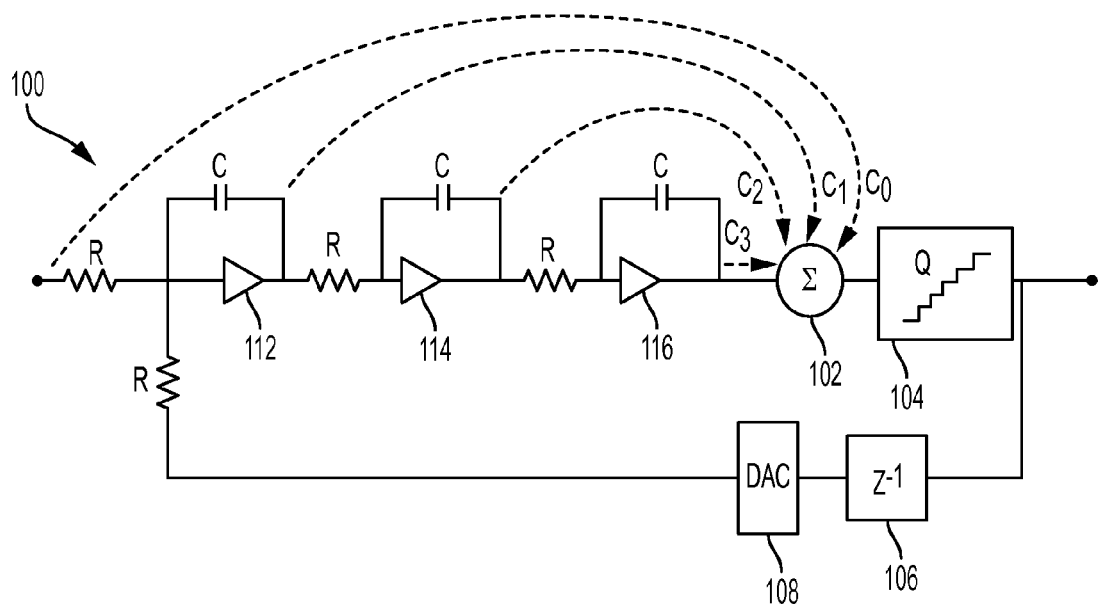
FIG. 1 is a circuit schematic illustrating an example continuous-time delta-sigma modulator with a feedforward path in accordance with the prior art.
Figure 2:
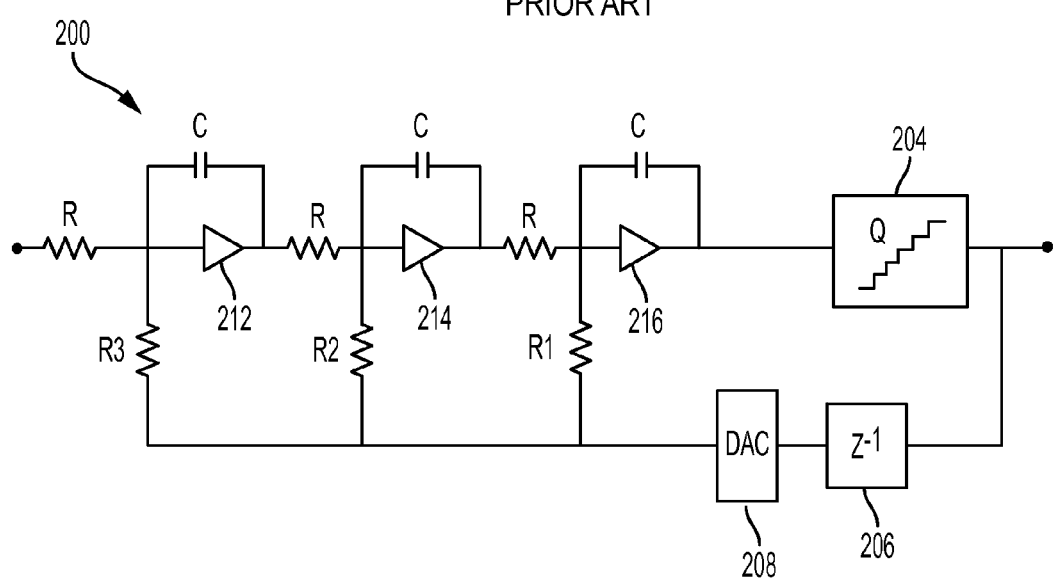
FIG. 2 is a circuit schematic illustrating an example continuous-time delta-sigma modulator with multiple feedback paths in accordance with the prior art.
Figure 3:
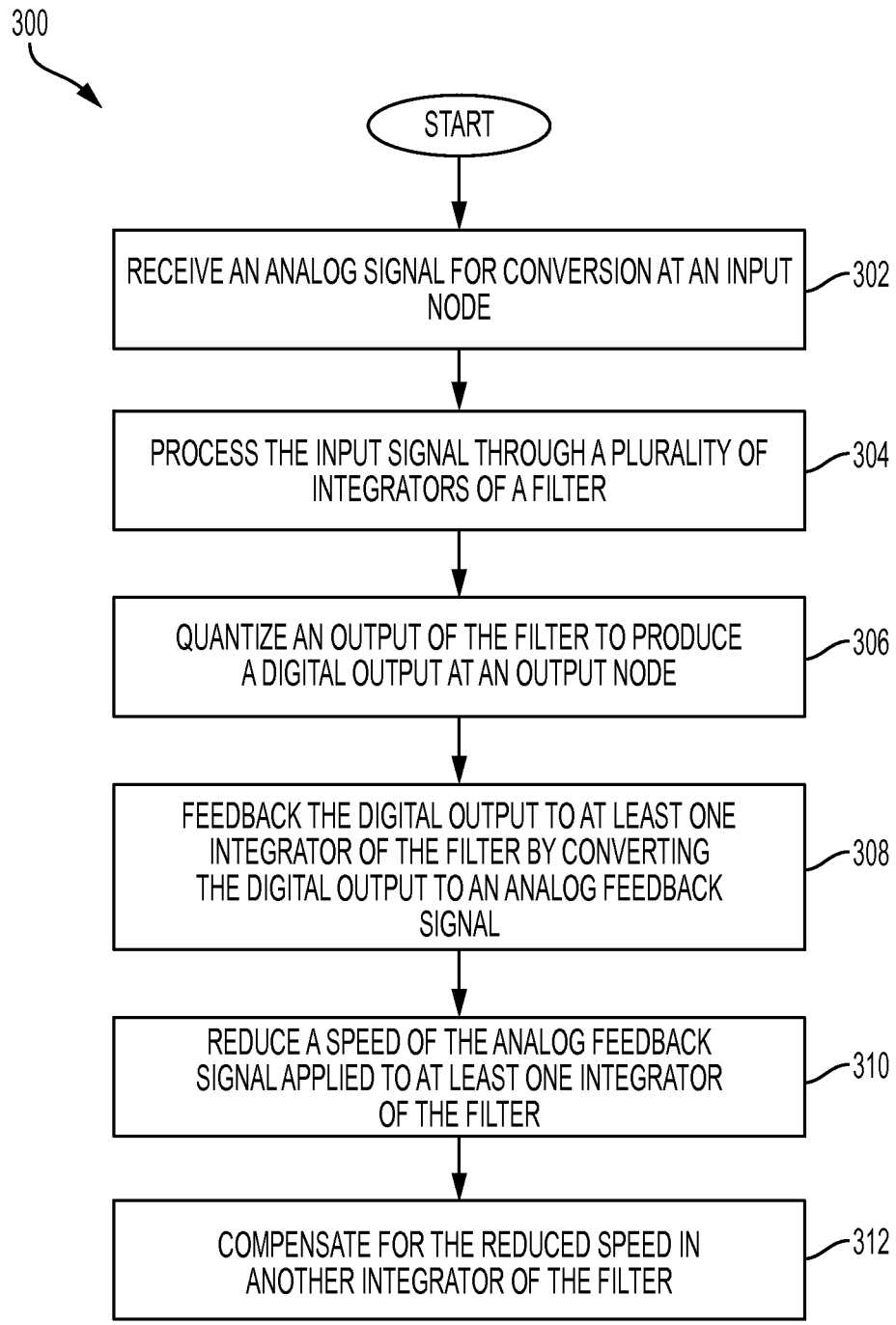
FIG. 3 is an example flow chart illustrating a method for converting an analog signal to a digital signal with a continuous-time delta-sigma modulator according to one embodiment of the disclosure.

FIG. 3 is an example flow chart illustrating a method for converting an analog signal to a digital signal with a continuous-time delta-sigma modulator according to one embodiment of the disclosure. A method 300 begins with receiving an analog input signal for conversion at an input node at block 302. Then, at block 304, the input signal is processed through a plurality of integrators of a filter. Next, at block 306, an output of the filter is quantized to produce an output digital signal at an output node. That output digital signal may be passed to other components for further processing or transmission. That output digital signal may also be fed back to at least a first integrator of the plurality of integrators through a feedback element at block 308. A characteristic of the feedback, such as the speed of the feedback, provided to the first integrator of the plurality of integrators, or other integrators, may be modified at block 310 to reduce requirements on those integrators. For example, the speed of the feedback may be reduced such that the first integrator may have reduced frequency response. Then, at block 312, the modified characteristic, such as reduced speed, may be compensated in another integrator of the plurality of integrators of the filter, such as by modifying a characteristic of one or more additional feedback paths to one or more other integrators of the filter.

Figure 4:
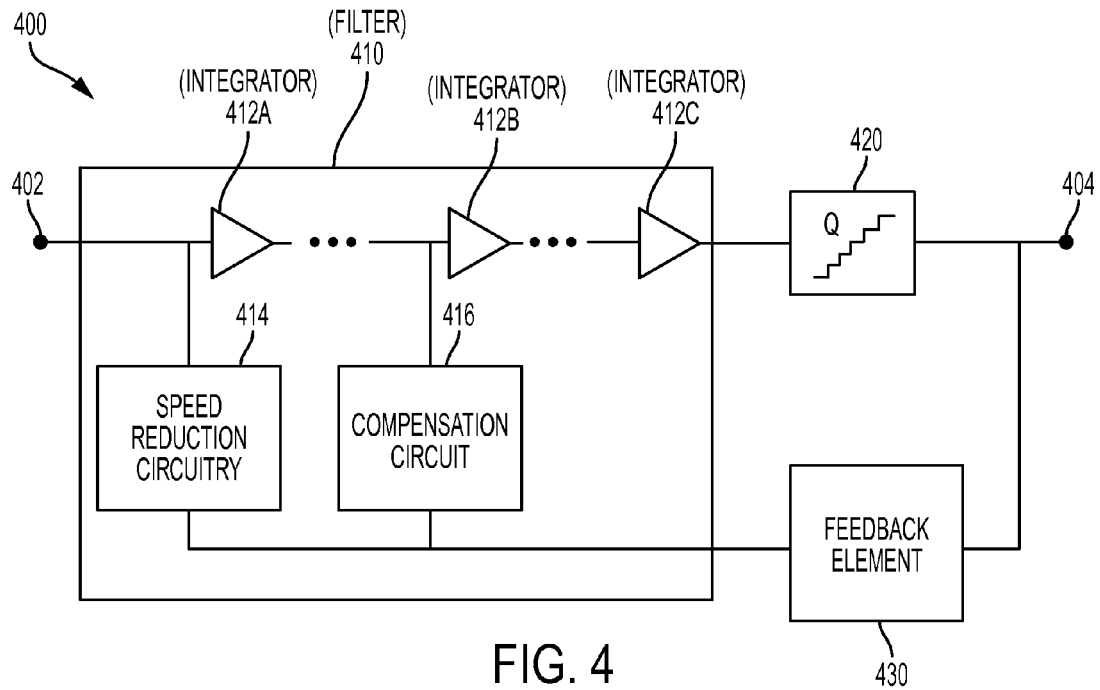
FIG. 4 is an example block diagram illustrating a continuous-time delta-sigma modulator according to one embodiment of the disclosure.

A block diagram is shown in FIG. 4 for a continuous-time delta-sigma modulator for performing the method shown in FIG. 3. FIG. 4 is an example block diagram illustrating a continuous-time delta-sigma modulator according to one embodiment of the disclosure. A delta-sigma modulator 400 may include a filter 410 having one or more integrators 412, such as 412A, 412B, and 412C. The output of the filter 410 is provided to a quantizer 420. An input analog signal received at input node 402 is processed in the filter 410 and the quantizer 420 to produce an output digital signal at output node 404. Feedback from the output node 404 is provided to the filter 410 through feedback element 430. Within the filter 410, speed reduction circuitry 414 may slow down a speed of a feedback signal from the feedback element 430 to one of the integrators 412, such as the integrator 412A. In one embodiment, the speed reduction circuitry 414 is coupled to a first integrator 412A of the filter 410 to reduce requirements on the integrator 412A. That is, the first integrator 412A may be a cheaper, slower, and/or lower power integrator than otherwise required by an integrator processing the analog input signal received at input node 402 and feedback signal from the feedback element 430. Additionally, the filter 410 may include compensation circuitry 416 coupled to at least one of the other integrators 412, such as integrator 412B. The compensation circuitry 416 compensates within the filter 410 for the effects of the speed reduction circuitry 414. In a feedback modulator, one possible compensation for circuitry 416 includes an extra path into the second integrator that has a low pass characteristic. In a feedforward modulator, one possible compensation modifies capacitors (such as C1 and C2 of the embodiment of FIG. 5 described below) and adds a feedback path to the quantizer with a flat response. In another embodiment of a feedforward modulator, that additional feedback path may be provided to the third integrator with the characteristic of a differentiator, such as by providing feedback through a capacitor.

The block diagram of FIG. 4 illustrates a use of speed reduction circuitry 414 and compensation circuitry 416 to reduce requirements on certain integrators within the filter 410. Although speed reduction is described as one manner of modifying a characteristic of the feedback provided to an integrator, and thus modifying the operation of the integrator, other characteristics may be modified to reduce requirements on the first integrator.

Figure 5:
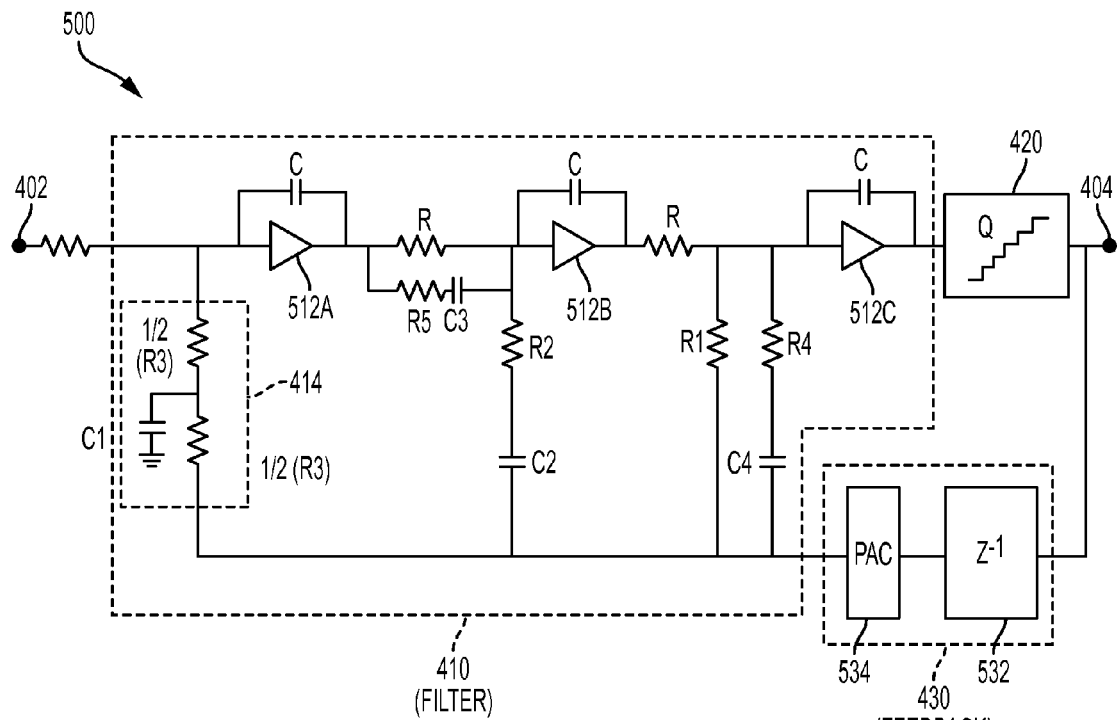
FIG. 5 is an example circuit schematic of a continuous-time delta-sigma modulator according to one embodiment of the disclosure.

A delta-sigma modulator constructed according to the block diagram of FIG. 4 may include feedforward, feedback, or a combination of feedforward and feedback within the filter 410. One embodiment of a delta-sigma modulator constructed using a combination of feedforward and feedback is shown in FIG. 5. FIG. 5 is an example circuit schematic of a continuous-time delta-sigma modulator according to one embodiment of the disclosure. A delta-sigma modulator 500 may include a feedforward path that includes resistors R, capacitors C, a first integrator 512A, a second integrator 512B, a third integrator 512C, and a quantizer 420 coupled in series between input node 402 and output node 404. The delta-sigma modulator 500 may also include a feedback loop path 430 having a delay block 532, a digital-to-analog converter (DAC) block 534, resistors R1, R2, ½*R3, R4, and R5, and capacitors C1, C2, C3, and C4. The delta-sigma modulator 500 receives an input signal IN at input node 402 and generates digital output signal DIG OUT at output node 404. In one embodiment, the delta-sigma modulator 500 is a third-order system with direct current (DC) noise transfer function (NTF) poles. However, in other embodiments, the modulator 500 may be a higher order design or have complex pair NTF zeroes.

Feedback resistor R3 of filter 410 may be divided, such as at the middle, to form two resistors with value ½*R3. A capacitor C1 may be coupled between the two resistors. The capacitor C1, along with resistors ½*R3 may be selected to obtain a particular time constant $\tau_1$. A selection of time constant $\tau_1$ to be approximately equal to a sampling period of the input signal IN may provide a good trade-off between bandwidth reduction and cost of the delta-sigma modulator 300.

Figure 6A:
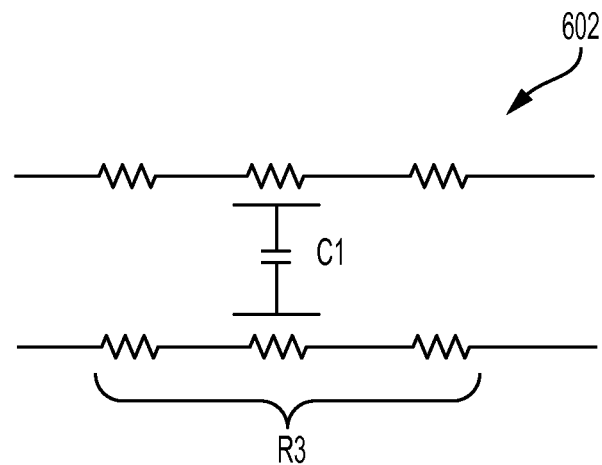
FIG. 6A is an example circuit showing an arrangement of combined resistor and capacitor.
Figure 6B:
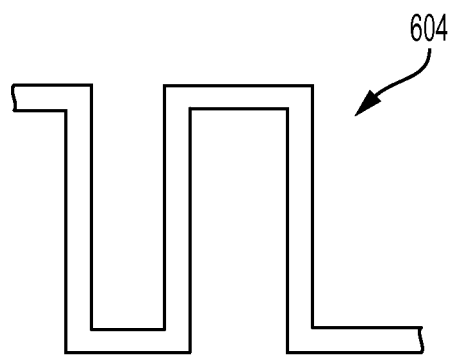
FIG. 6B is an example physical structure top view of an integrated circuit layer that includes a portion of a metal resistor and sidewall capacitance according to one embodiment of the disclosure.

One manner of implementing the arrangement of resistors R3 and capacitor C1 is in a combined resistor and capacitor physical structure and shown in FIG. 6A and FIG. 6B. FIG. 6A is an example circuit showing an arrangement of combined resistor and capacitor. Diagram 402 illustrates a division of resistor R3 in the middle with a capacitance C1 between the two portions of resistor R3. FIG. 6B shows an example physical structure 604 top view of an integrated circuit layer that includes a portion of a metal resistor that provide resistance ½*R3 and a sidewall capacitance C1 according to one embodiment of the disclosure.

The resistor and capacitor constructions shown in FIG. 6A and FIG. 6B or another physical construction of resistors and capacitors may be used to implement the speed reduction circuitry 414. In one embodiment, the speed reduction circuitry 414 may be configured as a low-pass filter to reduce the speed requirements of the first integrator 512A. Likewise, the compensation circuitry 416 may be implemented as a resistor and capacitor combination. For example, the compensation circuitry 416 may be implemented as a resistor-capacitor (R-C) series network with resistor R4 and capacitor C4. The combination of resistor R4 and capacitor C4 provide a time delay constant of $\tau_3$ that compensates for a phase delay introduced in filter 410 by the speed reduction circuitry 414. As another example, the compensation circuitry 416 may be implemented as an R-C network with resistors R2 and R5 and capacitors C2 and C3, respectively, with each R-C combination providing a time delay constant of $\tau_2$ that compensates for a phase delay introduced in filter 410 by the speed reduction circuitry 414.

To remove the input signal IN from the output of the first integrator 512A, two R-C networks comprising resistor R2 and capacitor C2 and resistor R5 and capacitor C3 may be added to provide a time constant of $\tau_2$. These two R-C networks remove the DC feedback path to the input of second integrator 512B. The first integrator 512A is thereby relieved from producing an output signal.

Figure 7:
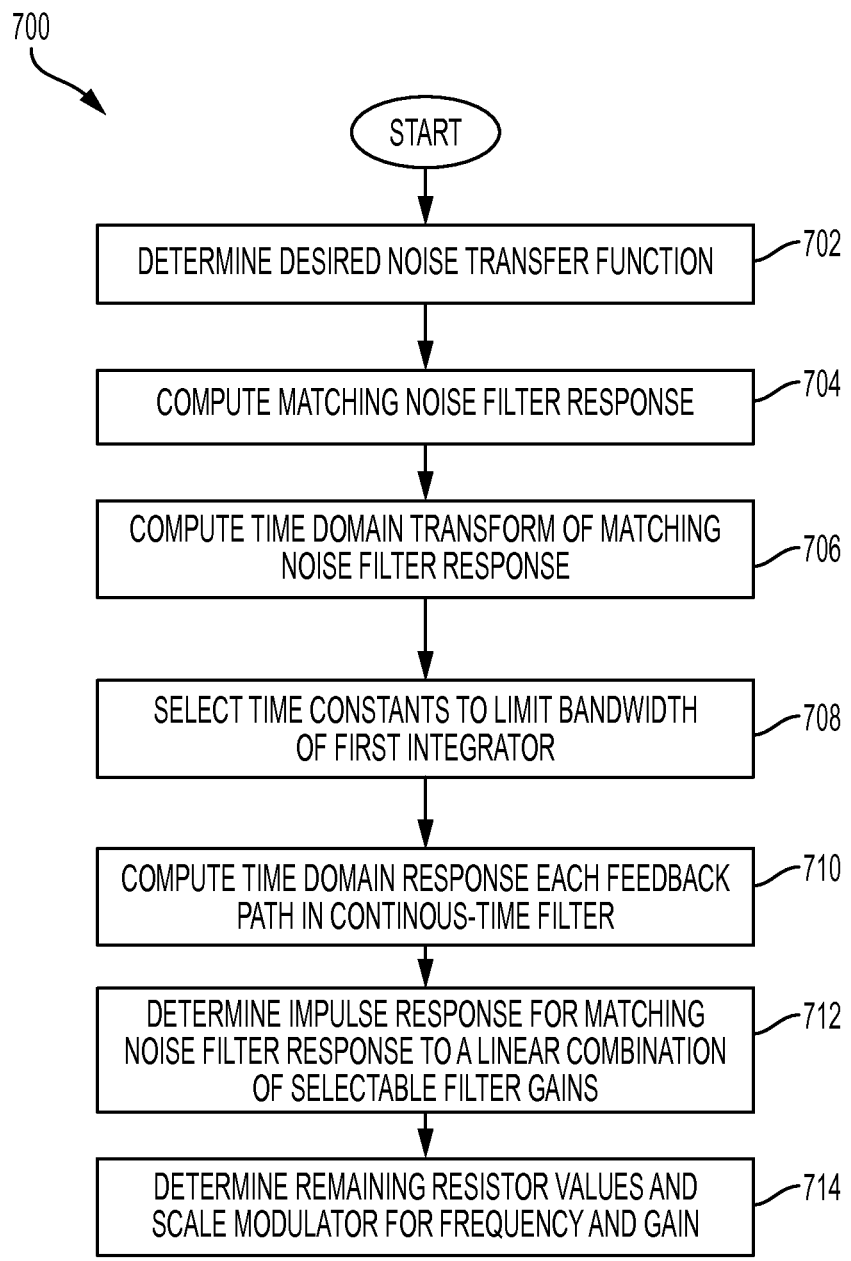
FIG. 7 is an example flow chart for determining values of the resistors and capacitors for a delta-sigma modulator according to one embodiment of the disclosure.

In the embodiment of FIG. 5, the speed reduction and compensation are implemented through R-C circuits with time constants that are appropriately selected to slow down and speed up portions of the filter of the delta-sigma modulator. Other examples of compensation circuits are described in U.S. Pat. No. 7,183,957, which is incorporated by reference herein. The values for the resistors and capacitors of FIG. 5 may be determined by performing the steps illustrated in FIG. 7. FIG. 7 is an example flow chart for determining values of the resistors and capacitors for a delta-sigma modulator according to one embodiment of the disclosure. A method 700 begins at block 702 with determining the desired noise-transfer function NTF(z). Then, at block 704, the matching noise filter response HN(z)=z (1−NTF(z))/NTF(z) may be computed. Next, at block 706, the time-domain (or inverse z transform) of a matching noise filter response HN(z) may be computed. Without loss of generality, the sample rate may be assumed to be 1 and the resistors R and capacitors C for integrators 512A, 512B, and 512C are assumed to be 1. Then, at block 708, time constants $\tau_1$ and $\tau_2$ are selected to appropriately limit the bandwidth of first integrator 512A. Next, at block 710, the time-domain response of each of the gain-selectable feedback paths in the continuous-time filter is computed, by assuming the associated feedback element, and possibly a respective resistor element, is 1, and all others have no conductance. In the embodiment of FIG. 5, there may be five (5) degrees of freedom associated with resistors R1, R2, R3, R4, and R5. Then, at block 712, an impulse response may be determined for matching noise filter response HN(z) to a linear combination of the selectable filter gains. This determination may be performed analytically, or through a least-means-square (LMS) fitting procedure with, for example, thirty (30) samples.

Next, at block 714, any unknown resistors are determined, and the modulator 300 can now be scaled for frequency and gain. In some embodiments, there may exist an exact or nearly exact solution to the component values. This exact solution may be due to the matching of the time constants $\tau_1$, $\tau_2$, and $\tau_3$ in the differing paths. In some embodiments, when the time constants are different, the function matching process produces a filter that generally has a transfer function to adequately match the prototype filter. This filter matching can also optimize filters with non-ideal amplifiers in the integrators.

The continuous-time delta-sigma modulator described above may be implemented as an analog-to-digital converter. Although analog-to-digital converters (ADCs) are described throughout the detailed description, aspects of the invention may be applied to the design of other converters, such as digital-to-analog converters (DACs) and digital-to-digital converters, or other circuitry and components based on delta-sigma modulation. The delta-sigma modulator designs described relieve the need for a fast first integrator at the input of the delta-sigma modulator. In practice, this elimination of such a fast first integrator often removes the need for a separate pre-amplifier in a data conversion system, as the amplifier designed for the pre-amplifier can be used as the first integrator. Such a modulator design can reduce power consumption of the system, often by a relatively large factor (often as much as a factor of four (4)), and also reduce the system noise floor. Further, such a modulator design offers improved linearity over conventional modulators, which may be beneficial in applications including seismic sensing, audio processing, and radio frequency (RF) circuits. In particular, jumps or other non-linearities in an input signal may cause large step changes in a feedback signal when the feedback DAC changes codes that then causes the first integrator to behave in a nonlinear fashion, which can cause distortion or noise folding.

The schematic flow chart diagram of FIG. 3 is generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A continuous-time converter configured to convert an analog signal to a digital signal, comprising:
    a filter comprising a plurality of integrators;
    a quantizer coupled to at least one of the plurality of integrators; and
    a feedback element coupled between the quantizer and at least one of the plurality of integrators,
    wherein the filter further comprises:
        first circuitry coupled to a first integrator of the plurality of integrators to change a characteristic of the first integrator, wherein the first circuitry comprises a low-pass filter comprising a resistor and a capacitor; and
        second circuitry coupled to another integrator of the plurality of integrators to compensate for the changed characteristic of the first integrator.

2. The converter of claim 1, wherein the first circuitry comprises a speed reduction path coupled between the feedback element and the first integrator of the plurality of integrators, and wherein the second circuitry comprises one or more additional paths in the converter after the first integrator of the plurality of integrators that compensates for the speed reduction path.

3. The converter of claim 2, wherein the low-pass filter is configured to slow down feedback arriving at the first integrator of the plurality of integrators.

4. The converter of claim 3, wherein the one or more additional paths comprises a second path configured to speed up subsequent integrators of the plurality of integrators of the filter to compensate for the slow down at the first integrator.

5. The converter of claim 2, wherein the resistor is a metal resistor and the capacitor is a sidewall capacitor attached to the metal resistor.

6. The converter of claim 2, wherein the one or more additional paths comprise a second path comprising a high-pass filter coupled between another integrator of the plurality of integrators and the feedback element.

7. The converter of claim 1, wherein the feedback element comprises a digital-to-analog converter (DAC).

8. A method, comprising:
    receiving an analog input signal for conversion at an input node;
    processing the input signal through a plurality of integrators of a filter;
    quantizing an output of the filter to produce an output signal at an output node;
    feeding back the output signal to at least a first integrator of the plurality of integrators through a feedback element;
    modifying a characteristic of the feedback provided to the first integrator of the plurality of integrators by applying a low-pass filter comprising a resistor and a capacitor to the feedback applied to the first integrator; and
    compensating for the modified characteristic in another integrator of the plurality of integrators of the filter.

9. The method of claim 8, wherein the step of modifying the characteristic comprises reducing a speed of the feedback.

10. The method of claim 9, wherein the step of reducing the speed of the feedback comprises applying the low-pass filter to the feedback applied to the first integrator.

11. The method of claim 10, wherein the step of compensating for the modified characteristic comprises applying a high-pass filter to feedback applied to a second integrator of the plurality of integrators.

12. The method of claim 9, wherein the step of reducing the speed of the feedback comprises reducing a frequency response of the first integrator.

13. The method of claim 9, wherein the step of compensating comprises compensating with one or more additional paths including a path to the other integrator.

14. An analog-to-digital converter, comprising:
an input node configured to receive an input analog signal;
an output node configured to output a digital signal representation of the input analog signal; and
a continuous-time converter configured to perform steps comprising:
processing the input analog signal through a plurality of integrators of a filter;
quantizing an output of the filter to produce the digital signal representation at the output node;
feeding back the digital signal representation to at least a first integrator of the plurality of integrators through a feedback element;
modifying a characteristic of the feedback provided to the first integrator of the plurality of integrators by applying a low-pass filter comprising a resistor and a capacitor; and
compensating for the modified characteristic in another integrator of the plurality of integrators of the filter.

15. The analog-to-digital converter of claim 14, wherein the step of modifying the characteristic comprises reducing a speed of the feedback.

16. The analog-to-digital converter of claim 15, wherein the step of reducing the speed of the feedback comprises applying the low-pass filter to the feedback applied to the first integrator.

17. The analog-to-digital converter of claim 16, wherein the step of compensating for the modified characteristic comprises compensating for the reduced speed by applying a high-pass filter to feedback applied to a second integrator of the plurality of integrators.

18. The analog-to-digital converter of claim 15, wherein the step of compensating for the reduced speed comprises compensating with one or more additional paths including a path to the second integrator.

* * * * *